June 1, 1965 F. P. ALLES ETAL 3,186,844

FLEXIBLE PHOTOPOLYMERIZABLE ELEMENT

Filed July 26, 1962

INVENTORS
FRANCIS PETER ALLES
CHARLES WALTER SMITH

BY Francis A. Painter

ATTORNEY

United States Patent Office 3,186,844

Patented June 1, 1965

3,186,844

FLEXIBLE PHOTOPOLYMERIZABLE ELEMENT

Francis Peter Alles, Basking Ridge, and Charles Walter Smith, Red Bank, N.J., assignors to E. I. du Pont de Nemours and Company, Wilmington, Del., a corporation of Delaware Filed July 26, 1962, Ser. No. 212,681

4 Claims. (Cl. 96—87)

This invention relates to elements useful for the preparation of photopolymer printing plates. More specifically, it relates to such elements which have a thin photopolymerizable layer on a flexible support. It also relates to processes of making such elements in a continuous operation.

Photopolymer printing plates are well-known in the art and are becoming more and more popular in the printing industry. Such plates are obtained by exposing imagewise an element having a light sensitive layer comprising a polymerizable monomer and a suitable photoinitiator for the polymerization reaction. Under the influence of actinic radiation the photoinitiator becomes activated and induces the polymerization of the monomer. Thus, the exposed element comprises polymerized and unpolymerized areas in imagewise distribution corresponding to the light and dark areas, respectively, of the master used for the exposure. The exposed element can be used in a variety of ways. For example, treatment with a suitable solvent that dissolves the unpolymerized material but not the polymer results in a relief plate; proper selection of monomer and other ingredients gives a transfer element the unpolymerized areas of which can be transferred to a separate receptor sheet; the ingredients can be chosen so that either the polymerized or the unpolymerized areas are selectively ink receptive, thus giving an element useful for positive or negative offset printing.

A very important application of photopolymer printing plates is in letterpress printing. These plates require a relief-image the raised areas of which are inked and pressed against a suitable surface, e.g., a sheet of paper, thus giving a print. Such photopolymer printing plates have now achieved a high quality standard. Excellent such compositions and elements are disclosed in U.S. Patents 2,760,863; 2,791,504; 2,927,022; 2,902,365; 2,948,611; 2,972,540, and other patents. Printing plates made from such compositions furnish a print quality and have a press life comparable to the much more expensive metal plates.

To be used in ordinary printing presses the relief thickness of the printing plate must be of a certain minimum depth. Plates having a 0.015 to 0.040 inch deep relief are typical. This depth is required in order to prevent large non-printing areas from picking up ink and transferring it to the paper. In small non-printing areas, e.g., the wells between the dots of a half-tone plate, the relief is considerably shallower, of the order of 0.001 inch or less.

The present trend in printing machine design is, however, directed toward high precision printing presses in which the inking operation of the plate is performed very accurately. These machines do not require the relief height necessary with ordinay presses and can therefore utilize much thinner printing plates.

Likewise, the so-called dry offset process requires only a shallow relief, i.e., a thin printing plate can be used.

It is an object of this invention to provide photopolymerizable elements for preparing printing plates of shallow relief for use with high precision printing presses.

It is a further object to provide such elements that have a dimensionally stable, light weight, film support. Yet another object is to provide a process for manufacturing such elements in a continuous operation and within narrow thickness tolerances. Other objects will appear hereinafter.

These and other objects are accomplished by the instant invention which is particularly pointed out in the appended claims and which is illustrated in its preferred embodiments in the accompanying drawings wherein:

Figure 1:
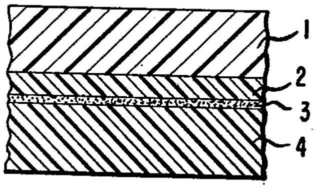
FIG. 1 shows a cross section of an element according to this invention.

Referring to FIG. 1, the photopolymerizable image layer 1 comprises an ethylenically unsaturated, addition polymerizable compound and a photoinitiator capable of initiating the polymerization reaction of the monomeric compound under the influence of actinic radiation. The image layer is preferably about 0.004 to 0.01 inch in thickness.

The barrier layer 2 consists of a partially polymerized stratum of the composition used in the image layer 1, preferably 0.001 to 0.002 inch thick.

The adhesive layer 3 is preferably composed of a copolyester adhesive material and a suitable thermally active curing agent. It is preferably about 0.0001 to 0.0002 inch in thickness.

The flexible support 4 is preferably a polymeric film such as 0.002 to 0.01 inch thick polyethylene terephthalate.

Figure 2:
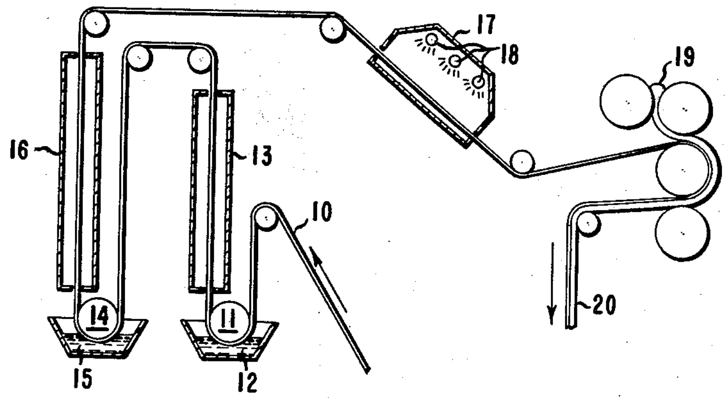
FIG. 2 shows schematically a method of making such an element in a continuous process.

FIGURE 2 shows schematically a preferred method of producing the photopolymerizable element. The flexible support 10 coming from a supply roll (not shown) is guided over a coating roll 11 where a solvent solution of the adhesive composition 12 is applied in a suitable amount. The coated support then passes through the drier 13 in which the solvent is evaporated and the solid adhesive coating thermally pollymerized (cured). The thermal curing of the adhesive layer is performed at about 100 to 150° C. for about 2 to 20 minutes, preferably at about 120° C. for about 10 minutes. It is to be understood that the curing or polymerization of this layer should be incomplete. Too high a degree of curing can prevent a strong bonding of the adjacent layer. The curing of the adhesive layer can continue in the finished element at room temperature for several days. Thus, aging of the element may tend to strengthen the adhesive bond. The so-treated support is then guided over a second coating roll 14 where a solvent solution of the photopolymerizable barrier layer composition 15 is applied. After evaporation of the solvent in drier 16 the barrier layer is polymerized by exposure to actinic radiation from suitable light sources 18 located in a housing 17. This layer, too, must not be overcured or a poor bond of the adjacent image layer could be obtained. The preferred barrier layer composition disclosed above gives a satisfactory degree of curing or polymerization at an exposure of about 0.85 to 14 watt sec./square inch of actinic radiation, preferably about 5 to 10 watt sec./square inch.

The adhesive and barrier layers are preferably coated on the supporting web from a solution. Any coating method that gives satisfactory thickness control is applicable, e.g., dip coating, reverse roll coating, etc. Other methods not requiring a solution of the materials can also be used, e.g., extrusion or calendering.

The adhesive and barrier layers can both contain the same type of polymerization initiators, i.e., thermal or photoinitiators. In this case it is possible to apply the barrier layer over the uncured, but dried, adhesive layer and cure the two layers simultaneously by exposure to heat or actinic radiation, depending on the type of initiator used.

The so-prepared support is then fed into a calender where the photopolymerizable composition 19 is laminated to the barrier layer of the support to form the finished element 20. Preferably an inverted L calender with individually heatable rolls is used, but other roll arrangements are possible, e.g., Z calenders and "in line" calenders.

The roll temperature is adjusted so that the photopolymerizable composition becomes soft and plastic. Usually, temperatures of about 75° to about 145° C., preferably about 85° C. to about 125° C., are within a practical range for the preferred photopolymerizable compositions. Other compositions, however, may require different temperatures. The photopolymerizable layers are coated on the element in the absence of actinic radiation; yellow or orange light is usually satisfactory. The finished product is stored in the absence of actinic radiation until it is used.

The finished element can be provided with a laminated cover sheet of suitable material as described below to afford protection to the surface and prevent damage during shipping. This cover sheet should be removed before exposing the element.

Figure 3:
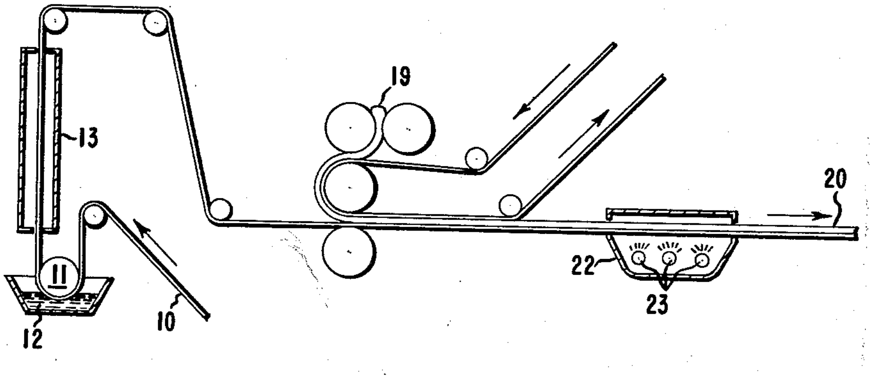
FIG. 3 shows another embodiment of the method of making the element in FIG. 1.

FIGURE 3 shows another embodiment of the method of producing the photopolymerizable element of this invention. The adhesive 12 is applied to the support 10 and dried and cured as in FIGURE 2. The adhesive coated support is fed into the calender where the photopolymerizable composition 19, supported by an auxiliary support or tracking web 21 is laminated to the adhesive-coated support. This tracking web is necessary because the photopolymerizable composition does not easily separate from the hot calender roll in absence of a barrier layer. It was found that the adhesive becomes relatively plastic at the calendering temperature and loses some of its bonding strength. The soft photopolymerizable composition, on the other hand, has a tendency of adhering to the hot calendering roll. The result of these two phenomena is delamination of the product. Satisfactory lamination is achieved by using a tracking web of, e.g., cellulose triacetate, thin polyethylene terephthalate with suitable surface treatments or other material. Once the calendered material is cooled below about 60° C. the adhesive material has regained its bonding strength and the tracking web can be stripped off; however, the tracking web is advantageously left on the element, thus forming a protective cover sheet that prevents damage to the photopolymerizable surface during shipping. The cover sheet should be stripped off before exposing the element. The resulting element is exposed through the support in station 22 to actinic radiation from the light sources 23. This exposure is controlled very accurately in order to polymerize only a 0.001 to 0.002 inch thick stratum of the photopolymerizable layer adjacent to the adhesive layer. In producing the barrier layer in the manner described in relation to FIG. 2, relatively higher exposure levels are required to overcome the effects of oxygen inhibition at the barrier layer/air interface. In barrier layer preparation by exposure through the support as described in relation to FIG. 3, there is no oxygen inhibition problem and a narrower exposure range is employed, preferably about 0.04 to 0.08 watt sec./in.$^2$. This stratum forms the barrier layer, thus giving the complete element 20. While the formation of a barrier layer by exposure to actinic radiation is preferably performed through the transparent support, it can also be formed by carefully administered, preferably intermittent exposure through the image layer. Such a process is disclosed in assignee's U.S. patent application of Thommes Serial No. 145,447, filed October 16, 1961. It is also applicable with elements that use an opaque, e.g., metal.

An alternate, although not preferred method of forming a barrier layer consists in performing an image-wise exposure of the photopolymerizable layer followed by an incomplete washout process. Careful adjustment of the washout conditions, i.e., time, temperature, solution strength, leaves a thin layer of unpolymerized composition in the non-image areas. This thin layer can be photopolymerized by an over-all exposure after washout, thus leaving a barrier layer.

The barrier layer has several very important functions in the elements of this invention, one of which is improved relief character anchorage. When the barrier layer is formed in the preferred manner, i.e., about 1.5 mils thick and polymerized by passing under a 2–4000 watt mercury vapor lamp 2 inches away at about 3–6 ft./min., the character bonds are stronger than the support. The barrier layer also prevents plastic flow of the adhesive during calendering, thereby preventing streaks due to adhesive flow, and also allows calendering without the need for a separate tracking web.

In a specific and preferred embodiment of this invention the photopolymerizable element comprises:

(1) A thin photopolymerizable layer having a thickness of about 0.004 to 0.01 inch of a photopolymerizable composition comprising:
  (a) An addition polymerizable, non-gaseous, ethylenically unsaturated compound, having a boiling point above 100° C. at normal atmospheric pressure and being capable of forming a high polymer by free-radical initiated, chain-propagating addition polymerization,
  (b) a free-radical generating addition polymerization initiator activatable by actinic radiation and thermally inactive below about 85° C., preferably below about 185° C.
  (c) A compatible, polymeric binding agent;

(2) A 0.0005 to 0.003 inch thick, preferably about 0.001 to 0.002 inch thick, barrier layer of a substantially polymerized composition defined above under (1);

(3) A 0.0001 to 0.001 inch thick, preferably about 0.0001 to 0.0003 inch thick, adhesive layer comprising a copolyester of ethylene glycol and terephthalic, isophthalic, adipic and sebacic acids defined according to claim 3 of U.S. Patent No. 2,892,747, a diisocyanate curing agent and an anti-halation dye;

(4) A flexible, polymeric support of about 0.002 to 0.01 inch thickness or more of polyethylene terephthalate film made according to U.S. Patents 2,627,088 and 2,779,684, having a thin substratum of vinylidene chloride/acrylic ester/itaconic acid copolymer.

The invention is further illustrated, but in no way limited, by the following examples:

*Example I*

An adhesive solution was prepared comprising:

| | G. |
|---|---|
| Terephthalate copolyester | 190 |
| Diepoxide | 19 |
| Pyromellitic anhydride/polyol adduct | 9 |
| Polyisocyanate adduct | 36 |
| Dioxane | 1834 |
| Toluene | 1835 |
| Cyclohexanone | 75 |
| Capracyl Yellow (Color Index Acid Yellow 113) | 6 |

The terephthalate copolyester is made up from ethylene glycol and mixed dicarboxylic component units in the following percentages: terephthalic 40, isophthalic 40, adipic 10 and sebacic 10. It is obtained according to U.S. Patent 2,892,747.

The diepoxide is the 3,4-epoxy,6-methylcyclohexylmethyl 3,4-epoxy,6-methylcyclohexane carboxylate. This compound is commercially available as Epoxide 201 from Union Carbide Corporation.

The pyromellitic dianhydride/polyol adduct is the condensation product of two moles of pyromellitic dianhydride and one mole of 2,2-bis[4-(2-hydroxy-ethanoxy)-phenyl] propane.

The polyisocyanate adduct is the condensation product of 5 moles of toluylene diisocyanate with 2 moles of trimethylolpropane in the presence of methyl isobutyl ketone, the resulting solution of the adduct having about 8.3 to 8.9% of reactive non-condensed isocyanate groups.

This adhesive solution was skim coated on a nominally 0.007 inch thick polyethylene terephthalate film base made according to U.S. Patents 2,627,088 and 2,779,684, having a resin substratum of vinylidene chloride/acrylic ester/itaconic acid copolymer. The adhesive coated film was then cured in a heated chamber for 10 minutes at a temperature of 120° C. The cured adhesive layer had a thickness of about 0.0002 inch.

The adhesive coated film was then coated with a solution of a photopolymerizable composition dissolved in acetone (12% solids). The photopolymerizable composition was the same as that used for the image layer and is described below in more detail. After evaporation of the solvent, the thin photopolymerizable layer was exposed to the light of a high pressure mercury arc lamp. The exposure was 7 watt sec./square inch of actinic radiation. The resulting barrier layer had a thickness of 0.001 inch.

The so-treated web was then fed into a 4-roll inverted L calender as shown in FIGURE 2 where it was laminated to a 0.006 inch thick sheet of photopolymerizable composition at 100–105° C. The photopolymerizable composition comprised 33 parts of triethylene glycol diacrylate, 67 parts of cellulose acetate succinate, 0.13 part of 2-ethylanthraquinone and 0.13 part of p-methoxyphenol, all parts being by weight. It was prepared according to U.S. Patent 3,012,952.

The resulting element was given an imagewise exposure of 10.5 watt sec./square inch of actinic radiation through a combination line and halftone photographic transparency placed in intimate contact with the photopolymerizable layer. The exposed element was spray-washed for 2 minutes at 20° C. with 0.04 N aqueous sodium hydroxide solution. The resulting relief image had a relief depth of 0.006 inch and was of excellent quality. In a rotary printing press, it produced high quality prints. Essentially no signs of plate wear were noticed after 100,000 impressions.

*Example II*

Example I was repeated, but the barrier layer was formed after calendering. A 0.007 inch thick polyethylene terephthalate web having a resin sublayer was coated with an adhesive solution as in Example I, except that the amount of polyisocyanate curing agent was increased to 180 g. After drying and heat curing the adhesive layer, a 0.008 inch thick photopolymerizable layer was applied in an inverted L calender at a roll temperature of 100–105° C., using a cellulose triacetate tracking web and the calender threadup as shown in FIG. 3. The tracking web could be stripped readily after the product was cooled to about 50° C. or lower. The calendered web was then guided over a bank of mercury vapor lamps arranged in such a way that a uniform exposure to 0.05 watt sec./square inch of actinic radiation was received, applied through the film support, in order to form a barrier layer between the adhesive layer and the photopolymerizable image layer.

The resulting element was then exposed imagewise and spray-washed as in Example I. The resulting relief image had a relief depth of 0.006 to 0.0065 inch. Therefore, the barrier layer formed by the exposure through the support was 0.0015 to 0.002 inch thick. The relief plate was used on a rotary printing press. The print quality and the press life of the plate were comparable with those of Example I.

*Example III*

Example I was repeated, except that the diepoxide compound and the pyromellitic anhydride/polyol adduct were omitted from the adhesive coating.

The finished product was similar to the one of Example I and a printing plate was made as described in that example. On a dry offset press it gave excellent prints and no plate wear was noticed after 150,000 impressions.

*Example IV*

Three elements (A, B and C) were made according to Example I, except that the curing agent in the adhesive layer was increased to 360 g. in element (A), to 650 g. in element (B) and to 830 g. in element (C). The finished elements (A) and (B) showed excellent adhesion between the barrier layer and the support, whereas in element (C) the two layers could be separated where it was obvious that the adhesive was "overcured." Elements (A) and (B) gave high quality printing plates, but element (C) showed some edge-lifting after the washout operation which made this plate unsuitable for printing.

*Example V*

Example I was repeated, using 180 g. of curing agent in the adhesive composition. The photocuring of the barrier layer was carried out at 3 exposure levels. Part 1 of the layer was exposed to 0.85 watt second/square inch, part 2 to 14 watt seconds/square inch and part 3 to 52 watt seconds/square inch. Parts 1 and 2 of the finished element showed excellent adhesion between the barrier layer and the image layer, whereas the bond between these two layers was very poor in part 3. Apparently, the barrier layer of part 3 was "overcured."

The preferred photopolymerizable compositions are those disclosed in U.S. Patents 2,791,504 and 2,927,022. These compositions comprise (a) a non-gaseous addition polymerizable ethylenically unsaturated compound having a boiling point above 100° C., a molecular weight of less than 1500 and being capable of forming a high polymer by photo-initiated polymerization in the presence of an addition polymerization initiator activatable by actinic radiation, (b) an addition polymerization initiator activatable by actinic radiation and thermally inactive below 185° C. (c) a polymerization inhibitor and (d) an essentially linear cellulose derivative, said component (a) constituting about 10% to about 60% by weight, said component (b) about 0.01 to about 5% and said component (d) about 40% to about 90% by weight of the total composition. The polymerization inhibitor (c) is dissolved in the addition polymerizable compound (a) in an amount of 0.001 to 2 percent based on component (a).

A wide variety of compounds can be used as the ethylenically unsaturated addition polymerizable compound in the preferred composition according to this invention. The preferred compound is triethylene glycol diacrylate. Other suitable compounds are: unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene glycol dimethacrylate, triethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetraacrylate and tetramethacrylate, 1,3-propanediol diacrylate, 1,5-pentanediol dimethacrylate, the bisacrylates and methacrylates of polyethylene glycols of molecular weight 200–1500, and the like. A portion of the above described monomers can be replaced by N-(beta-hydroxyethyl)methacrylamide, N-N-bis(beta-hydroxyethyl)acrylamide, beta-acetoamidoethyl methacrylate and beta-methacrylamidoethyl propionate; olefin blends with ethylenic alpha, beta-dicarboxylic acid or esters thereof, e.g., styrene/diethyl fumerate, styrene/diethyl maleate; esters of vinylbenzoic acid, e.g., methyl vinyl benzoate and beta-hydroxyethyl vinyl benzoate.

With respect to the photopolymerizable layers of the novel photopolymerizable elements of this invention, a very satisfactory photopolymerizable composition is a mixture of cellulose acetate hydrogen succinate, triethylene glycol diacrylate, 2-ethylanthraquinone, and p-methoxyphenol as the inhibitor. Other photopolymerizable compositions of the type described in U.S. Patent 2,760,863 can also be used to form solid photopolymerizable layers. Suitable additional compositions are N-methoxymethyl polyhexamethylene adipamide mixtures described in British Patent 826,272; the polyester, polyacetal or mixed polyester acetal of U.S. Patent 2,892,716; the polyvinyl alcohol derivative compositions of U.S. Patent 2,902,365 and those comprising cellulose acetate (60% by weight), triethylene glycol diacrylate (40% by weight), anthraquinone, photoinitiator (0.1% based on photopolymerizable material), and p-methoxyphenol, polymerization inhibitor (0.1% based on photopolymerizable material); polyvinyl ether and ester compositions of U.S. Patent 2,927,023; water soluble cellulose ether and ester compositions of British Patent 834,337; polyvinyl acetal compositions having extra linear vinylidene groups as taught by U.S. Patent 2,929,710; 1,3-butadiene compositions of U.S. Patent 3,024,180 and linear polyamide compositions containing extralinear N-acrylyloxymethyl groups as taught by U.S. Patent 2,972,540.

In a preferred embodiment of the invention the photopolymerizable image layer can be solvent cast onto the element. A suitable solution of a photopolymerizable composition is prepared by slurrying a cellulose ester, e.g., cellulose acetate, in an organic solvent, e.g., acetone, with a dicarboxylic acid anhydride, e.g., succinic anhydride, and a tertiary amine esterification catalyst together with an addition polymerizable ethylenically unsaturated monomer, an initiator therefor and other desired adjuvants. This mixture is refluxed until the desired degree of esterification between the anhydride and the cellulose ester is achieved and then filtered. Such compositions and methods for their preparation are described in assignee's U.S. application of Smith, Serial No. 99,072, filed March 29, 1961.

In the photopolymerizable layers of the elements of this invention, there can be used practically any initiator of addition polymerization that is capable of initiating polymerization under the influence of actinic light. The preferred photoinitiators are not significantly activatable thermally at temperatures below 185° C. They should be dispersible in the photopolymerizable compositions to the extent necessary for initiating the desired polymerization under the influence of the amount of light energy absorbed in relatively short-term exposures.

A preferred class of addition polymerization initiators activatable by actinic light and thermally inactive at and below 185° C. are the substituted or unsubstituted polynuclear quinones, which are compounds having two intracyclic carbonyl groups attached to introcyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

Suitable thermal polymerization inhibitors that can be used in addition to the preferred p-methoxyphenol include hydroquinone and alkyl- and aryl-substituted hydroquinones, tert-butyl catechol, pyrogallol copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., thionine (C.I. No. 920), thionine blue G (C.I. No. 926), methylene blue B (C.I. No. 922) and toluidine blue O (C.I. No. 925).

The barrier layer is of the same compositions as the photopolymerizable image layer. The alternate compositions mentioned above also apply to this barrier layer. In another modification the barrier layer composition can contain a thermal polymerization initiator in which case the photocuring would be replaced by a heat treatment. Suitable thermal initiators are those that are activatable at temperatures below 180° C. but not below about 60° C. A preferred initiator of this type is benzoyl peroxide, but other suitable compounds are, e.g., tert-butyl peroxide, tert-butyl hydroperoxide, cumene hydroperoxide, succinic acid peroxide, lauroyl peroxide, p-chlorobenzoyl peroxide, 2,4-dichlorobenzoyl peroxide, and cyclohexanone peroxide.

The adhesive layer is preferably of a heat curable type. Besides the materials listed in the preceding examples, compounds of the types disclosed in the following patents and applications are useful: U.S. Patents 2,892,747; 2,961,365; 2,765,251; 2,820,735; 2,673,826; 2,719,100; 3,036,913; 3,030,254 and assignee's U.S. application of Chambers, Serial No. 718,410, filed March 2, 1958, now U.S. Patent No. 3,117,901.

Adhesives can also be used that contain a photo-initiator. Such materials are cured by exposure to actinic radiation. Examples of this type of adhesive are disclosed in assignee's U.S. application of Thommes, Serial No. 145,447, filed October 16, 1961.

The adhesive contains preferably a light absorptive material to provide halation protection for the light sensitive photopolymerizable composition. Besides the preferred compound Capracyl Yellow (Color Index Acid Yellow 113), other dyes such as Eastone Yellow (C.I. Disperse Yellow 5), Metanil Yellow (C.I. Acid Yellow 36) or other compatible dyes that absorb actinic radiation can be used. Alternatively, colored pigments incorporated in the adhesive layer provide good halation protection. Suitable pigments are disclosed in U.S. Patent 2,760,863. The antihalation dye or pigments can also be applied in a separate layer on either side of the transparent base support, or can be incorporated in the support material itself.

The adhesive layer can also contain inert filler materials such as finely divided silica, bentonite, powdered glass, etc.

The support is preferably a relatively thin, transparent material. High molecular weight, oriented polyesters, e.g., polyethylene terephthalate, polycarbonates, etc., and the materials disclosed in U.S. Patents 3,036,990, 3,036,991 and 3,036,992 are particularly suitable for this application because of their great physical strength and excellent dimensional stability characteristics. Preferably these materials have a thin coating or sublayer of resin on at least one surface. Materials without said sublayer can be used, but may, however, require some modification of the adhesive composition.

Polyester films which are stretched asymmetrically, e.g., to different degrees longitudinally and laterally, show improved tensile and dimensional properties and tend to improve printing performance of elements made therefrom, e.g., by giving registration, etc. Such films can be prepared according to U.S. Patents 2,884,663 and 2,975,484.

Other base materials useful for this invention include the various film-forming compounds listed in U.S. Patent 2,760,863. The sole conditions governing the choice of a particular base material are stability at the process temperatures of this invention and adequate bonding to the adhesive layer.

Although transparent support materials are preferred, opaque supports can be used. Thus, polymeric materials containing various pigments or opaque fillers can be used as well as thin, flexible metal sheets such as steel and aluminum, and paper, fabrics, etc.

The elements of this invention are advantageous over those of the prior art in that they provide means for making high quality prints from shallow relief images. The elements are light in weight and flexible, they can easily and cheaply be packaged and transported. Manufacturing costs are relatively low. The transparent support material does not have to be optically perfect; low cost, second class material is satisfactory for this application.

The proposed processes have additional advantages. They allow for continuous operation which, in itself, is more economical than a batch process. They do not require any specialized equipment nor skill to produce high quality material. Other advantages will be obvious to technicians skilled in the art of photopolymer printing plates.

What is claimed is:

1. A thin, flexible photopolymerizable element for use in preparing shallow relief, high-precision printing plates which comprises:
- (1) a thin layer of a photopolymerizable composition comprising:
  - (a) an addition polymerizable, non-gaseous ethylenically unsaturated compound, having a boiling point above 100° C. at normal atmospheric pressure and being capable of forming a high polymer by free-radical initiated, chain-propagating addition polymerization,
  - (b) a free-radical generating addition polymerization initiator activatable by actinic radiation and thermally inactive below about 85° C., and
  - (c) a compatible, polymeric binding agent;
- (2) a barrier layer from about 0.0005 to 0.003 inch in thickness of a partially polymerized composition defined above under (1);
- (3) a layer from about 0.0001 to 0.001 inch in thickness of a thermally curable copolyester adhesive composition containing a diisocyanate curing agent; and
- (4) a thin, flexible support layer.

2. A thin, flexible photopolymerizable element for use in preparing shallow relief, high-precision printing plates which comprises:
- (1) a layer of photopolymerizable composition from about 0.004 to 0.01 inch in thickness comprising:
  - (a) an addition polymerizable, non-gaseous, ethylenically unsaturated compound, having a boiling point above 100° C. at normal atmospheric pressure and being capable of forming a high polymer by free-radical initiated, chain-propagating addition polymerization,
  - (b) a free-radical generating addition polymerization initiator activatable by actinic radiation and thermally inactive below about 85° C., and
  - (c) a compatible, polymeric binding agent;
- (2) a barrier layer from about 0.001 to 0.002 inch in thickness of a partially polymerized composition defined above under (1);
- (3) a layer from about 0.0001 to 0.0003 inch in thickness of a thermally curable adhesive composition comprising a copolyester of ethylene glycol and terephthalic, isophthalic, adipic and sebacic acids; a diisocyanate curing agent and an antihalation dye; and
- (4) a flexible polyethylene terephthalate film layer from about 0.002 to 0.01 inch in thickness having on its surface adjacent layer (3) a thin substratum of vinylidene chloride/acrylic ester/itaconic acid copolymer.

3. An element according to claim 2 wherein the film layer (4) is an asymmetrically stretched polyethylene terephthalate film.

4. A thin, flexible photopolymerizable element for use in preparing shallow relief, high-precision printing plates which comprises:
- (1) a thin layer of a photopolymerizable composition comprising:
  - (a) an addition polymerizable, non-gaseous ethylenically unsaturated compound, having a boiling point above 100° C. at normal atmospheric pressure and being capable of forming a high polymer by free-radical initiated, chain-propagating addition polymerization,
  - (b) a free-radical generating addition polymerization initiator activatable by actinic radiation and thermally inactive below 85° C., and
  - (c) a compatible, polymeric binding agent;
- (2) a barrier layer from about 0.0005 to 0.003 inch in thickness of a partially polymerized composition defined above under (1);
- (3) a layer from about 0.0001 to 0.0003 inch in thickness of an adhesive composition comprising a copolyester of ethylene glycol and terephthalic, isophthalic, adipic and sebacic acids; and a diisocyanate curing agent; and
- (4) a thin, flexible support layer.

References Cited by the Examiner

UNITED STATES PATENTS

| | | | |
|---|---|---|---|
| 2,101,061 | 12/37 | Gordon | 260—89.5 |
| 2,892,716 | 6/59 | Martin | 96—115 |
| 2,929,710 | 3/60 | Martin | 96—115 |
| 2,964,401 | 12/60 | Plambeck. | |
| 2,993,789 | 7/61 | Crawford. | |
| 3,002,851 | 10/61 | Sorkin | 117—34 |
| 3,036,913 | 5/62 | Burg. | |
| 3,061,453 | 10/62 | Rogers | 117—34 |

FOREIGN PATENTS 864,041 12/60 Great Britain.

OTHER REFERENCES

Boundy et al.: Styrene—Its Polymers, Copolymers and Derivatives, Reinhold (1952), pp. 288–291.

References Cited by the Applicant

UNITED STATES PATENTS 2,874,080 2/59 Schweitzer et al.

FOREIGN PATENTS 861,835 3/61 Great Britain.

NORMAN G. TORCHIN, *Primary Examiner.*

UNITED STATES PATENT OFFICE
CERTIFICATE OF CORRECTION

Patent No. 3,186,844

June 1, 196

Francis Peter Alles et al.

It is hereby certified that error appears in the above numbered patent requiring correction and that the said Letters Patent should read as corrected below.

Column 3, line 69, after "opaque" insert -- support --; column 8, line 63, after "giving" insert -- improved --.

Signed and sealed this 23rd day of November 1965.

(SEAL)
Attest:

ERNEST W. SWIDER
Attesting Officer

EDWARD J. BRENNER
Commissioner of Patents